(12) United States Patent
Zhang et al.

(10) Patent No.: US 12,499,825 B2
(45) Date of Patent: Dec. 16, 2025

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Zhenhua Zhang, Beijing (CN); Yingsong Xu, Beijing (CN); Jingyi Feng, Beijing (CN); Changlong Yuan, Beijing (CN); Xilei Cao, Beijing (CN); Yao Hu, Beijing (CN); Guoqiang Tang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 71 days.

(21) Appl. No.: 18/289,225

(22) PCT Filed: Nov. 16, 2021

(86) PCT No.: PCT/CN2021/131018
§ 371 (c)(1),
(2) Date: Nov. 2, 2023

(87) PCT Pub. No.: WO2022/233120
PCT Pub. Date: Nov. 10, 2022

(65) Prior Publication Data
US 2024/0257734 A1    Aug. 1, 2024

(30) Foreign Application Priority Data
May 6, 2021 (CN) .......................... 202110491409.8

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC ... G09G 2300/0426; G09G 2300/0465; G09G 2300/0819; G09G 2300/0842;
(Continued)

(56) References Cited

U.S. PATENT DOCUMENTS 9,595,546 B2    3/2017  Kim et al.
10,763,451 B2   9/2020  Lius et al.
(Continued)

FOREIGN PATENT DOCUMENTS

CN    105612620 A    5/2016
CN    107154407 A    9/2017
(Continued)

OTHER PUBLICATIONS

International Search Report and Written Opinion mailed on Feb. 11, 2022, in corresponding PCT/CN2021/131018, 7 pages.
Office Action issued on Mar. 1, 2023, in corresponding Chinese patent Application No. 202110491409.8, 14 pages.

*Primary Examiner* — Nitin Patel
*Assistant Examiner* — Amen W Bogale
(74) *Attorney, Agent, or Firm* — XSENSUS LLP

(57) ABSTRACT

The present application relates to the technical field of displays. Provided are a display panel and a display apparatus. The display panel comprises a first pixel driving circuit, wherein the first pixel driving circuit comprises a low-temperature polysilicon transistor and an oxide transistor. The display panel further comprises: a base substrate, a first conductive layer and a third conductive layer, wherein
(Continued)

the first conductive layer comprises a first gate line, and part of the structure of the first gate line is used for forming a gate electrode of the low-temperature polysilicon transistor; the third conductive layer comprises a second gate line, and part of the structure of the second gate line is used for forming a gate electrode of the oxide transistor; and the orthographic projection of the first gate line on the base substrate extends in a first direction.

18 Claims, 10 Drawing Sheets

(52) U.S. Cl.
CPC ............... *G09G 2300/0465* (2013.01); *G09G 2300/0819* (2013.01); *G09G 2300/0842* (2013.01); *G09G 2310/08* (2013.01)

(58) Field of Classification Search
CPC ............. G09G 2310/08; G09G 3/3233; H10K 59/1213; H10K 59/131
See application file for complete search history.

(56) References Cited

U.S. PATENT DOCUMENTS

| | | |
|---|---|---|
| 10,916,185 B1 | 2/2021 | Dai et al. |
| 2009/0195489 A1 | 8/2009 | Hung et al. |
| 2015/0310801 A1* | 10/2015 | Lin ...................... H10K 59/123 |
| | | 345/205 |
| 2016/0240565 A1 | 8/2016 | Kim et al. |
| 2018/0062105 A1 | 3/2018 | Lius et al. |
| 2020/0265779 A1* | 8/2020 | In ......................... G09G 3/3225 |
| 2020/0343471 A1 | 10/2020 | Lius et al. |
| 2021/0111239 A1* | 4/2021 | Cho ..................... H10K 59/131 |

FOREIGN PATENT DOCUMENTS

| | | |
|---|---|---|
| CN | 110649043 A | 1/2020 |
| CN | 113224123 A | 8/2021 |
| EP | 3113226 A1 | 1/2017 |
| EP | 3113226 B1 | 5/2019 |
| TW | 200935149 A | 8/2009 |
| TW | I367381 B | 7/2012 |

* cited by examiner

DISPLAY PANEL AND DISPLAY APPARATUS

CROSS-REFERENCE TO RELATED APPLICATIONS

This application is a U.S. National Stage of International Application No. PCT/CN2021/131018, filed on Nov. 16, 2021, which claims priority to the Chinese Patent Application No. 202110491409.8, entitled "Display Panel and Display Apparatus", filed on May 6, 2021, the entire contents of which are incorporated herein by reference in its entirety.

TECHNICAL FIELD

The disclosure relates to the technical field of display, in particular to a display panel and a display apparatus.

BACKGROUND

In the related art, in order to reduce the leakage current of the driving transistor in the light emitting stage, the pixel driving circuit can be formed by low temperature polycrystalline oxide (LTPO) technology. The display panel formed by LTPO technology includes an N-type oxide transistor and a P-type low-temperature polysilicon transistor. The oxide transistor and the low-temperature polysilicon transistor respectively requires separate gate lines to provide gate driving signals to them, so that the pixel driving circuit has a large layout area.

It should be noted that the information disclosed in the above background technology section is intended only to enhance the understanding of the background of the present disclosure, and thus may include information that does not constitute prior art known to those of ordinary skill in the art.

SUMMARY

According to an aspect of the present disclosure, there is provided a display panel, wherein the display panel includes a first pixel driving circuit, the first pixel driving circuit includes a low-temperature polysilicon transistor and an oxide transistor, the display panel further includes: a base substrate; a first conductive layer, located on a side of the base substrate, wherein the first conductive layer includes a first gate line, and a part of a structure of the first gate line is used to form a gate of the low-temperature polysilicon transistor; and a third conductive layer, located on a side of the first conductive layer away from the base substrate, wherein the third conductive layer includes a second gate line, and a part of a structure of the second gate line is used to form a gate of the oxide transistor, wherein an orthographic projection of the first gate line on the base substrate extends along a first direction, an orthographic projection of the second gate line on the base substrate extends along the first direction, and the orthographic projection of the first gate line on the base substrate at least partially overlaps with the orthographic projection of the second gate line on the base substrate.

In an example embodiment of the present disclosure, the first pixel driving circuit further includes a driving transistor, the first pixel driving circuit includes at least one oxide transistor and at least one low-temperature polysilicon transistor, the at least one oxide transistor includes a second transistor, and the at least one low-temperature polysilicon transistor includes a fourth transistor, a first electrode of the fourth transistor is connected to a data signal terminal, and a second electrode of the fourth transistor is connected to a first electrode of the driving transistor, a first electrode of the second transistor is connected to a gate of the driving transistor, and a second electrode of the second transistor is connected to a second electrode of the driving transistor; the first conductive layer includes at least one first gate line, and the at least one first gate line includes: a first gate driving signal line, wherein a part of a structure of the first gate driving signal line is used to form a gate of the fourth transistor; the third conductive layer includes at least one second gate line, and the at least one second gate line includes: a second gate driving signal line, wherein at least a part of a structure of the second gate driving signal line is configured to form a first gate of the second transistor.

In an example embodiment of the present disclosure, the first pixel driving circuit is used to drive a first light emitting unit, the at least one oxide transistor includes a first transistor, and the at least one low-temperature polycrystalline silicon transistor includes a fifth transistor and a sixth transistor, a first electrode of the first transistor is connected to the gate of the driving transistor, a second electrode of the first transistor is connected to a second initial signal terminal, a first electrode of the fifth transistor is connected to a first power supply terminal, a second electrode of the fifth transistor is connected to the first electrode of the driving transistor, a first electrode of the sixth transistor is connected to the second electrode of the driving transistor, and a second electrode of the sixth transistor is connected to the first light emitting unit, the first conductive layer includes at least one first gate line, the at least one first gate line includes: an enable signal line, wherein a part of a structure of the enable signal line is used to form gates of the fifth transistor and the sixth transistor; the third conductive layer includes at least one second gate line, the at least one second gate line includes: a third gate driving signal line, wherein a part of a structure of the third gate driving signal line is used to form a first gate of the first transistor; wherein an orthographic projection of the third gate driving signal line on the base substrate at least partially overlaps with an orthographic projection of the enable signal line on the base substrate.

In an example embodiment of the present disclosure, the display panel further includes: a second active layer, located between the first conductive layer and the third conductive layer, wherein a part of a structure of the second active layer is used to form channel regions of the first transistor and the second transistor; a second conductive layer, located between the first conductive layer and the second active layer, wherein the second conductive layer includes a third gate line and a fourth gate line, an orthographic projection of the third gate line on the base substrate extends along the first direction, and an orthographic projection of the fourth gate line on the base substrate extends along the first direction; wherein a part of a structure of the third gate line is used to form a second gate of the second transistor, and the orthogonal projection of the third gate line on the base substrate at least partially overlaps with an orthogonal projection of the first gate driving signal line on the base substrate; a part of a structure of the fourth gate line is used to form a second gate of the first transistor, and the orthogonal projection of the fourth gate line on the base substrate at least partially overlaps with the orthogonal projection of the enable signal line on the base substrate.

In an example embodiment of the present disclosure, any segment of the orthographic projection of the first gate driving signal line on the base substrate in its extension direction at least partially overlaps with an orthogonal projection of the second gate driving signal line on the base substrate; any segment of the orthographic projection of the third gate driving signal line on the base substrate in its extension direction at least partially overlaps with the orthographic projection of the enable signal line on the base substrate; any segment of the orthographic projection of the third gate line on the base substrate in its extension direction at least partially overlaps with the orthographic projection of the first gate driving signal line on the base substrate; any segment of the orthographic projection of the fourth gate line on the base substrate in its extension direction at least partially overlaps with the orthogonal projection of the enable signal line on the base substrate.

In an example embodiment of the present disclosure, the first conductive layer further includes: a first conductive part, for forming the gate of the driving transistor, wherein an orthographic projection of the first conductive part on the base substrate is located between an orthographic projection of the second gate driving signal line on the base substrate and the orthographic projection of the third gate driving signal line on the base substrate.

In an example embodiment of the present disclosure, the display panel further includes: a first active layer, located between the base substrate and the first conductive layer, wherein a part of a structure of the first active layer is used to form a channel region of the low-temperature polysilicon transistor; a second active layer, located between the first conductive layer and the third conductive layer, wherein a part of a structure of the second active layer is used to form a channel region of the oxide transistor, wherein an orthographic projection of the first active layer on the base substrate at least partially overlaps with the an orthographic projection of the second active layer on the base substrate.

In an example embodiment of the present disclosure, the first pixel driving circuit is used to drive a first light emitting unit, the first pixel driving circuit further includes a driving transistor, the first pixel driving circuit includes at least one oxide transistor and at least one low-temperature polysilicon transistor, the at least one oxide transistor includes a first transistor and a second transistor, and the at least one low-temperature polysilicon transistor includes a sixth transistor; a first electrode of the first transistor is connected to a gate of the driving transistor, a second electrode of the first transistor is connected to a second initial signal terminal, a first electrode of the second transistor is connected to the gate of the driving transistor, a second electrode of the second transistor is connected to a second electrode of the driving transistor, a first electrode of the sixth transistor is connected to the second electrode of the driving transistor, and a second electrode of the sixth transistor is connected to the first light emitting unit; the second active layer includes a first active part, the first active part includes a first sub-active part, a second sub-active part, and a third sub-active part connected between the first sub-active part and the second sub-active part, wherein the first sub-active part is used to form a channel region of the first transistor, the second sub-active part is used to form a channel region of the second transistor, and an orthographic projection of the first active part on the base substrate extends along a second direction, the first direction intersects with the second direction; the first active layer includes a sixth active part for forming a channel region of the sixth transistor, wherein an orthographic projection of the sixth active part on the base substrate at least partially overlaps with an orthographic projection of the first sub-active part on the base substrate.

In an example embodiment of the present disclosure, the first pixel driving circuit further includes a driving transistor, the first pixel driving circuit includes at least one oxide transistor and at least one low-temperature polysilicon transistor, and the at least one oxide transistor includes a first transistor and a second transistor; a first electrode of the first transistor is connected to a gate of the driving transistor, a second electrode of the first transistor is connected to a second initial signal terminal, a first electrode of the second transistor is connected to the gate of the driving transistor, a second electrode of the second transistor is connected to a second electrode of the driving transistor; the first active part includes a first sub-active part, a second sub-active part, and a third sub-active part connected between the first sub-active part and the second sub-active part, wherein the first sub-active part is used to form a channel region of the first transistor, the second sub-active part is used to form a channel region of the second transistor; the first active layer includes a third active part for forming a channel region of the driving transistor; the first conductive layer further includes a first conductive part, wherein an orthographic projection of the first conductive part on the base substrate covers an orthographic projection of the third active part on the base substrate, the first conductive part is used to form the gate of the driving transistor; the display panel further includes: a second conductive layer, located between the first conductive layer and the second active layer, wherein the second conductive layer includes a second conductive part, the second conductive part is used to connect a first power supply terminal, and an orthographic projection of the second conductive part on the base substrate at least partially overlaps with the orthographic projection of the first conductive part on the base substrate; an orthographic projection of that third sub-active part on the base substrate at least partially overlaps with the orthographic projection of the second conductive part on the base substrate.

In an example embodiment of the present disclosure, the first pixel driving circuit is used to drive a first light emitting unit, the first pixel driving circuit further includes a driving transistor, the first pixel driving circuit includes at least one oxide transistor and at least one low-temperature polysilicon transistor, the at least one oxide transistor includes a first transistor and a second transistor, and the at least one low-temperature polysilicon transistor includes a sixth transistor; a first electrode of the first transistor is connected to a gate of the driving transistor, a second electrode of the first transistor is connected to a second initial signal terminal, a first electrode of the second transistor is connected to the gate of the driving transistor, a second electrode of the second transistor is connected to a second electrode of the driving transistor, a first electrode of the sixth transistor is connected to the second electrode of the driving transistor, and a second electrode of the sixth transistor is connected to the first light emitting unit; the second active layer includes a first active part, wherein a part of a structure of the first active part is used to form channel regions of the first transistor and the second transistor, and an orthographic projection of the first active part on the base substrate extends along a second direction, the first direction intersects with the second direction; the first active layer includes a third active part and a sixth active part, wherein the third active part is used to form a channel region of the driving transistor, and the sixth active part is used to form a channel region of the sixth transistor; wherein, in the first direction, the orthographic projection of the first active part on the base substrate is located between an orthographic projection of the third active part on the base substrate and an orthographic projection of the sixth active part on the base substrate.

In an example embodiment of the present disclosure, the display panel further includes: a first active layer, located between the base substrate and the first conductive layer, wherein a part of a structure of the first active layer is used to form a channel region of the low-temperature polysilicon transistor; a second active layer, located between the first conductive layer and the third conductive layer, wherein a part of a structure of the second active layer is used to form a channel region of the oxide transistor, wherein an orthographic projection of the first active layer on the base substrate does not overlap with an orthographic projection of the second active layer on the base substrate.

In an example embodiment of the present disclosure, the first pixel driving circuit is used to drive a first light emitting unit, the first pixel driving circuit further includes a driving transistor, the first pixel driving circuit includes at least one oxide transistor and at least one low-temperature polysilicon transistor, the at least one oxide transistor includes a first transistor and a second transistor, and the at least one low-temperature polysilicon transistor includes a sixth transistor; a first electrode of the first transistor is connected to a gate of the driving transistor, a second electrode of the first transistor is connected to a second initial signal terminal, a first electrode of the second transistor is connected to the gate of the driving transistor, a second electrode of the second transistor is connected to a second electrode of the driving transistor, a first electrode of the sixth transistor is connected to the second electrode of the driving transistor, and a second electrode of the sixth transistor is connected to the first light emitting unit; the second active layer includes a first active part, wherein a part of a structure of the first active part is used to form channel regions of the first transistor and the second transistor, and an orthographic projection of the first active part on the base substrate extends along a second direction, the first direction intersects with the second direction; the first active layer includes a third active part and a sixth active part, wherein the third active part is used to form a channel region of the driving transistor, and the sixth active part is used to form a channel region of the sixth transistor; wherein, in the first direction, the orthographic projection of the first active part on the base substrate is located on a side of an orthographic projection of the sixth active part on the base substrate away from an orthographic projection of the third active part on the base substrate.

In an example embodiment of the present disclosure, the display panel further includes a first display area and a second display area, wherein a light transmittance of the first display area is greater than that of the second display area; wherein the first pixel driving circuit is used to provide driving current to a first light emitting unit, and the first pixel driving circuit and the first light emitting unit are located in the first display area.

In an example embodiment of the present disclosure, the display panel further includes a first display area and a second display area, wherein a light transmittance of the first display area is greater than that of the second display area; wherein the first pixel driving circuit is used to provide driving current to a first light emitting unit, the first light emitting unit is located in the first display area, and the first pixel driving circuit is located in the second display area.

According to an aspect of the present disclosure, there is provided a display apparatus, including the display panel described above.

In an example embodiment of the present disclosure, in a case that the display panel includes a first display area, the display apparatus further includes a sensing device, and the sensing device is directly opposite to the first display area It should be understood that the above general description and the later detailed descriptions are exemplary and explanatory only and do not limit the present disclosure.

BRIEF DESCRIPTION OF THE DRAWINGS

The accompanying drawings herein are incorporated into and form part of the specification, illustrate embodiments consistent with the present disclosure, and are used in conjunction with the specification to explain the principles of the present disclosure. It will be apparent that the accompanying drawings in the following description are only some embodiments of the present disclosure, and that other drawings may be obtained from the accompanying drawings without creative effort by one of ordinary skill in the art.

DETAILED DESCRIPTION

Figure 1:
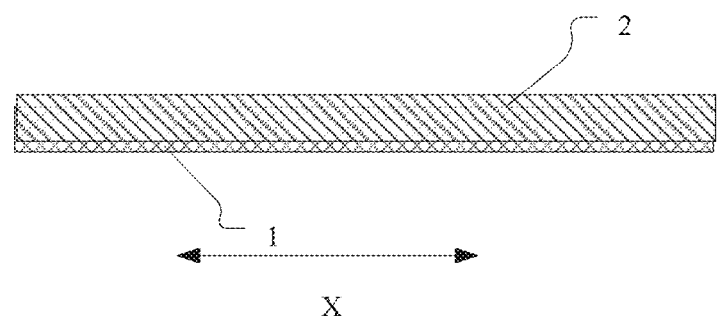
FIG. 1 is a partial structural layout of a display panel of an example embodiment of the present disclosure.

The example embodiments will now be described more fully with reference to the accompanying drawings. However, the example embodiments can be implemented in a variety of forms and should not be construed as being limited to the examples set forth herein; rather, the provision of these embodiments makes the present disclosure more comprehensive and complete and communicates the ideas of the example embodiments to those skilled in the art in a comprehensive manner. The same reference numerals in the drawings indicate the same or similar structures, and thus their detailed description will be omitted.

The terms "a", "an" and "the" are used to indicate the presence of one or more elements/components/etc.; the terms "including" and "having" are used to indicate an open-ended inclusion and refer to the presence of additional elements/components/etc. in addition to the listed elements/components/etc.

This example embodiment first provides a display panel, as shown in FIG. 1, which is a partial structural layout of a display panel of an example embodiment of the present disclosure. The display panel may include a first pixel driving circuit, which may include an oxide transistor and a low-temperature polysilicon transistor. The display panel may further include: a base substrate, a first conductive layer, and a third conductive layer. The first conductive layer may be located on a side of the base substrate. The first conductive layer may include a first gate line 1. A part of a structure of the first gate line 1 is used to form a gate of the low-temperature polysilicon transistor. The third conductive layer may be located on a side of the first conductive layer away from the base substrate. The third conductive layer may include a second gate line 2. A part of a structure of the second gate line 2 may be used to form a gate of the oxide transistor. An orthographic projection of the first gate line 1 on the base substrate may extend along a first direction X. An orthographic projection of the second gate line 2 on the base substrate may extend along the first direction X, and the orthographic projection of the first gate line 1 on the base substrate may at least partially overlap with the orthographic projection of the second gate line 2 on the base substrate. An insulating layer may be provided between the first conductive layer and the third conductive layer.

In this example embodiment, the second gate line 2 is arranged directly above the first gate line 1, which prevents the first gate line 1 and the second gate line 2 from occupying the layout area respectively, thereby reducing the layout area of the first pixel driving circuit.

In this example embodiment, as shown in FIG. 1, any segment of the orthographic projection of the second gate line 2 on the base substrate in its extension direction may at least partially overlap with an orthogonal projection of the first gate line 1 on the base substrate, so that the orthogonal projection of the overlapping part of the first gate line 1 and the second gate line 2 has the same extension direction as the orthogonal projection of the first gate line 1 on the base substrate. It should be understood that in other example embodiments, the orthographic projection of the second gate line on the base substrate can also be located on the orthographic projection of the first gate line on the base substrate, or the orthographic projection of the second gate line on the base substrate can also cover the orthographic projection of the first gate line on the base substrate, or the orthographic projection of the second gate line on the base substrate can also completely overlap with the orthographic projection of the first gate line on the base substrate, all of which are within the scope of this disclosure.

Figure 2:
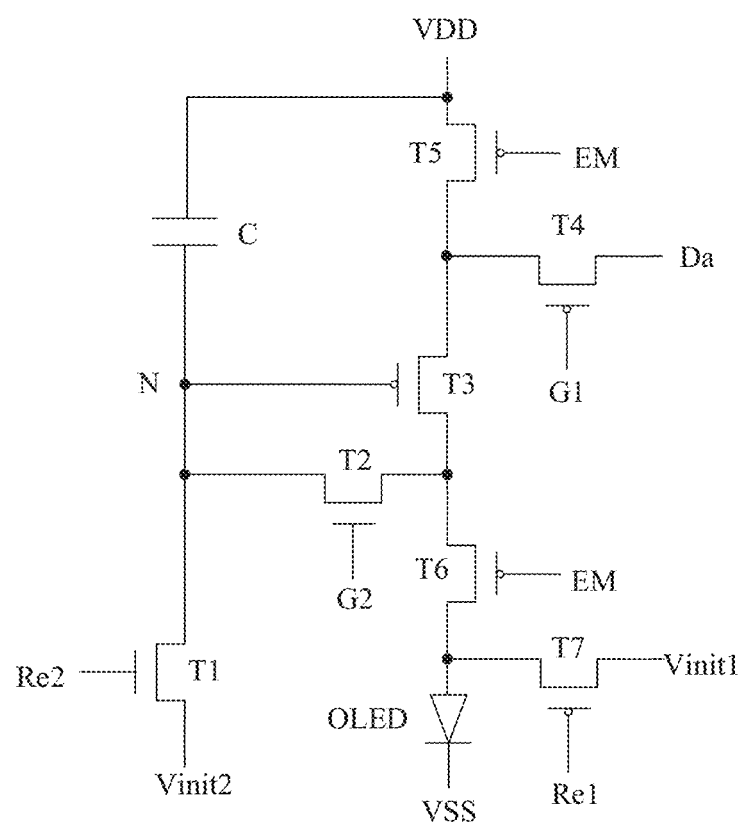
FIG. 2 is a schematic circuit structure diagram of a first pixel driving circuit of the present disclosure.

As shown in FIG. 2, it is a schematic circuit structure diagram of the first pixel driving circuit of the present disclosure. The pixel driving circuit may include a driving transistor T3, a first transistor T1, a second transistor T2, a third transistor T3, a fourth transistor T4, a fifth transistor T5, a sixth transistor T6, a seventh transistor T7, and a capacitor C. The first electrode of the fourth transistor T4 is connected to the data signal terminal Da, the second electrode of the fourth transistor T4 is connected to the first electrode of the driving transistor T3, and the gate of the fourth transistor T4 is connected to the first gate driving signal terminal G1. The first electrode of the fifth transistor T5 is connected to the first power supply terminal VDD, the second electrode of the fifth transistor T5 is connected to the first electrode of the driving transistor T3, and the gate of the fifth transistor T5 is connected to the enable signal terminal EM. The gate of the driving transistor T3 is connected to the node N. The first electrode of the second transistor T2 is connected to the node N, the second electrode of the second transistor T2 is connected to the second electrode of the driving transistor T3, and the gate of the second transistor T2 is connected to the second gate driving signal terminal G2. The first electrode of the sixth transistor T6 is connected to the second electrode of the driving transistor T3, the second electrode of the sixth transistor T6 is connected to the first electrode of the seventh transistor T7, the gate of the sixth transistor T6 is connected to the enable signal terminal EM. The second electrode of the seventh transistor T7 is connected to the first initial signal terminal Vinit1, and the gate of the seventh transistor T7 is connected to the first reset signal terminal Re1. The first electrode of the first transistor T1 is connected to the node N, the second electrode of the first transistor T1 is connected to the second initial signal terminal Vinit2, the gate of the first transistor T1 is connected to the second reset signal terminal Re2. The capacitor C is connected between the first power supply terminal VDD and the node N. The pixel driving circuit may be connected to a light emitting unit OLED, for driving the light emitting unit OLED to emit light. The light emitting unit OLED may be connected between the second electrode of the sixth transistor T6 and the second power supply terminal VSS. The first transistor T1 and the second transistor T2 can be N-type metal oxide transistors. The N-type metal oxide transistors have small leakage current, so that it can prevent the node N from leaking electricity through the first transistor T1 and the second transistor T2 in the light emitting stage. At the same time, the driving transistor T3, the third transistor T3, the fourth transistor T4, the fifth transistor T5, the sixth transistor T6, and the seventh transistor T7 can be P-type low-temperature polycrystalline silicon transistors. The low-temperature polycrystalline silicon transistors have high carrier mobility, thus being beneficial to realizing a display panel with high resolution, high reaction speed, high pixel density and high aperture ratio. The first initial signal terminal and the second initial signal terminal can output the same or different voltage signals according to the actual situation.

Figure 3:
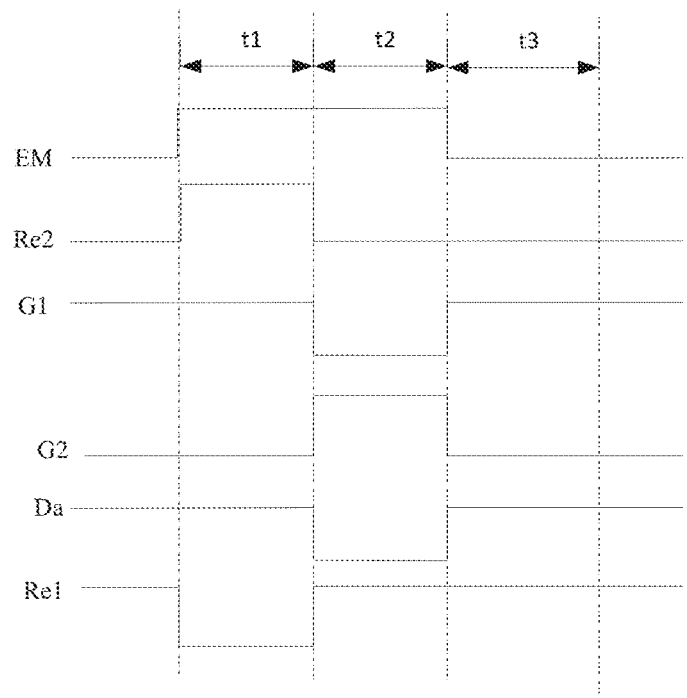
FIG. 3 is a timing chart of each node in a driving method of the first pixel driving circuit in FIG. 2.

As shown in FIG. 3, it is a timing diagram of each node in a driving method of the first pixel driving circuit in FIG. 2. G1 represents the timing of the first gate driving signal terminal G1, G2 represents the timing of the second gate driving signal terminal G2, Re1 represents the timing of the first reset signal terminal Re1, Re2 represents the timing of the second reset signal terminal Re2, EM represents the timing of the enable signal terminal EM, and Da represents the timing of the data signal terminal Da. The driving method of the pixel driving circuit may include a reset stage t1, a compensation stage t2, and a light emitting stage t3. In the reset stage t1, the second reset signal terminal Re2 outputs a high-level signal, the first reset signal terminal Re1 outputs a low-level signal, the first transistor T1 and the seventh transistor T7 are turned on, the second initial signal terminal Vinit2 inputs an initial signal to the node N, and the first initial signal terminal Vinit1 inputs an initial signal to the second electrode of the sixth transistor T6. In the compensation stage t2, the first gate driving signal terminal G1 outputs a low-level signal, the second gate driving signal terminal G2 outputs a high-level signal, the fourth transistor T4 and the second transistor T2 are turned on, and the data signal terminal Da outputs a driving signal to write the voltage Vdata+Vth to the node N, where Vdata is the voltage of the driving signal and Vth is the threshold voltage of the driving transistor T3. In the light emitting stage t3, the enable signal terminal EM outputs a low-level signal, the sixth transistor T6 and the fifth transistor T5 are turned on, and the driving transistor T3 emits light under the action of the voltage Vdata+Vth stored in the capacitor C. According to the output current formula of the driving transistor, $I=(\mu WCox/2L)(Vgs-Vth)^2$, where u is carrier mobility; Cox is the gate capacitance per unit area, w is the channel width of the driving transistor, L is the channel length of the driving transistor, Vgs is the gate-source voltage difference of the driving transistor, and Vth is the threshold voltage of the driving transistor, the output current of the driving transistor in the pixel driving circuit of the disclosure is $I=(\mu WCox/2L)(Vdata+Vth-Vdd-Vth)^2$. The pixel driving circuit can avoid the influence of the threshold of the driving transistor on its output current. It should be understood that the pixel driving circuit shown in FIG. 1 can also have other driving manners. For example, the seventh transistor T7 can be turned on in the compensation stage.

The oxide transistor in this example embodiment may be the first transistor in FIG. 2, and the low-temperature polysilicon transistor may be the fifth transistor or the sixth transistor in FIG. 2. The oxide transistor in this example embodiment may also be the second transistor in FIG. 2, and the low-temperature polysilicon transistor may also be the fourth transistor in FIG. 2. It should be understood that, in other example embodiments, the first pixel driving circuit in the display panel of the present disclosure can also have other structures, which are within the protection scope of the present disclosure.

Figure 4:
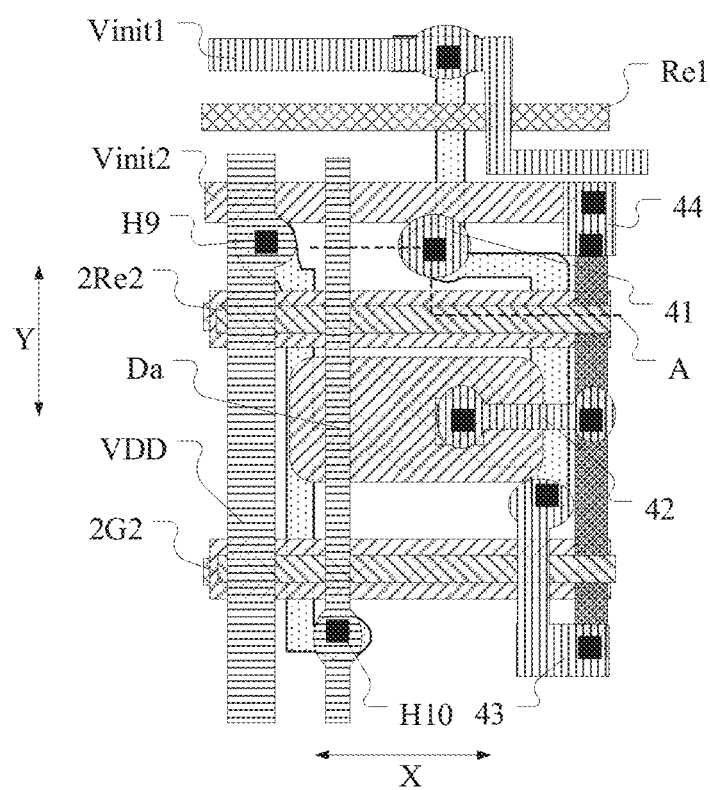
FIG. 4 is a structural layout of the display panel of another example embodiment of the present disclosure.
Figure 6:
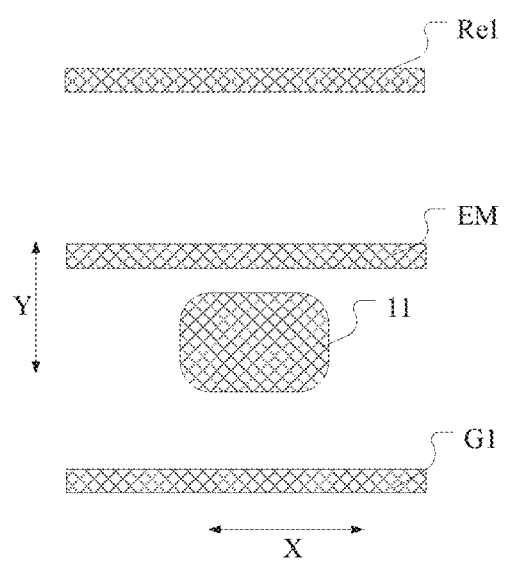
FIG. 6 is a structural layout of the first conductive layer in FIG. 4.
Figure 7:
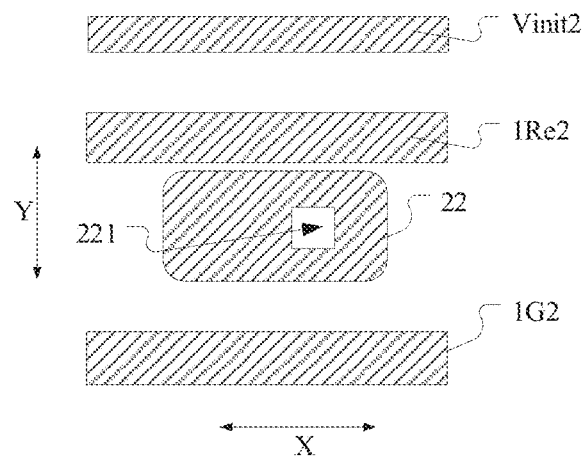
FIG. 7 is a structural layout of the second conductive layer in FIG. 4.
Figure 8:
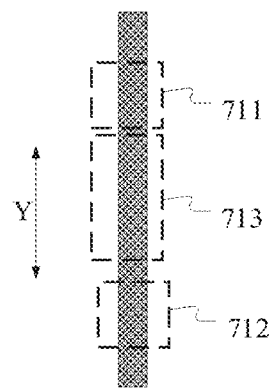
FIG. 8 is a structural layout of the second active layer in FIG. 4.
Figure 9:
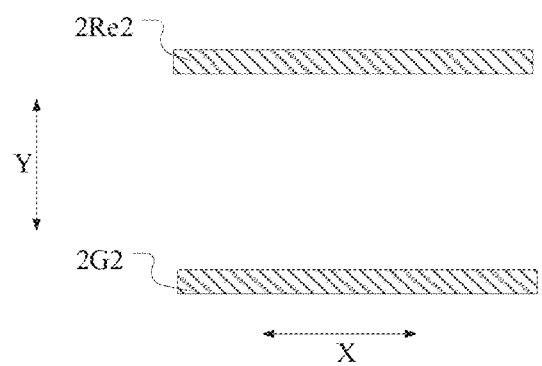
FIG. 9 is a structural layout of the third conductive layer in FIG. 4.
Figure 10:
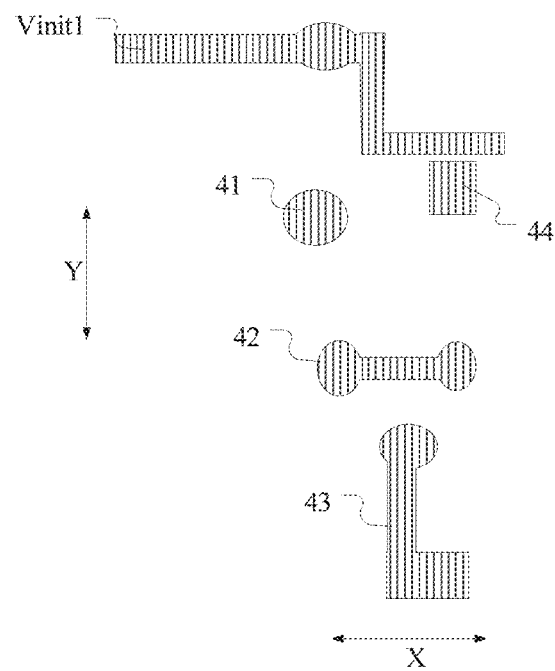
FIG. 10 is a structural layout of the fourth conductive layer in FIG. 4.
Figure 11:
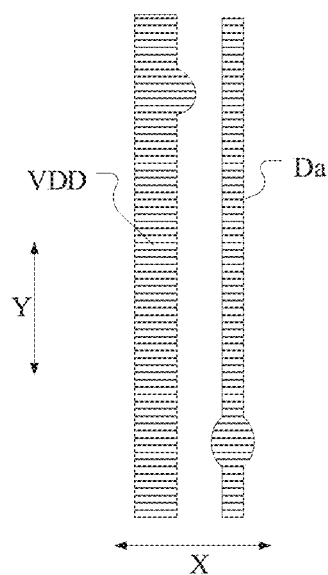
FIG. 11 is a structural layout of the fifth conductive layer in FIG. 4.
Figure 12:
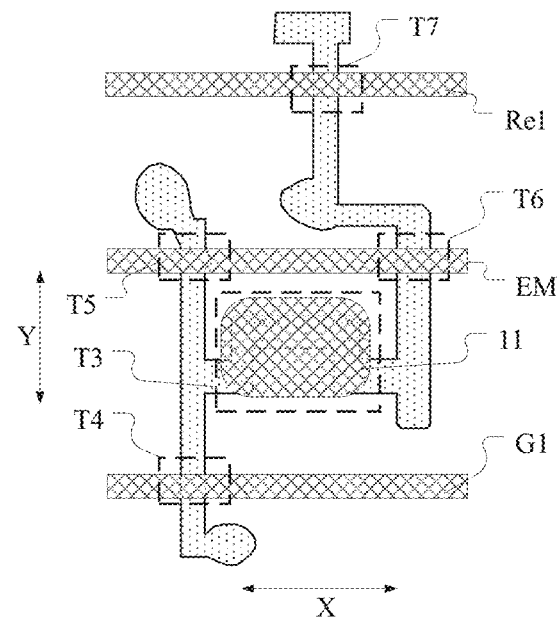
FIG. 12 is a structural layout of the first active layer and the first conductive layer in FIG. 4.
Figure 13:
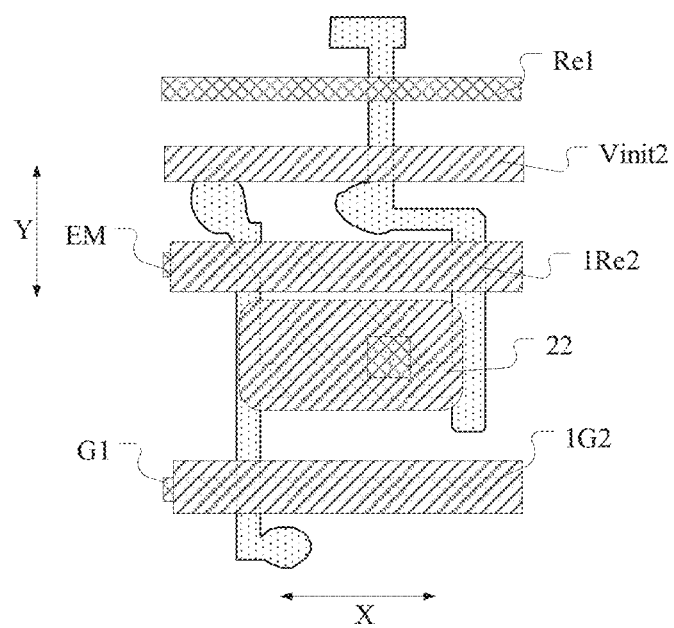
FIG. 13 is a structural layout of the first active layer, the first conductive layer and the second conductive layer in FIG. 4.
Figure 14:
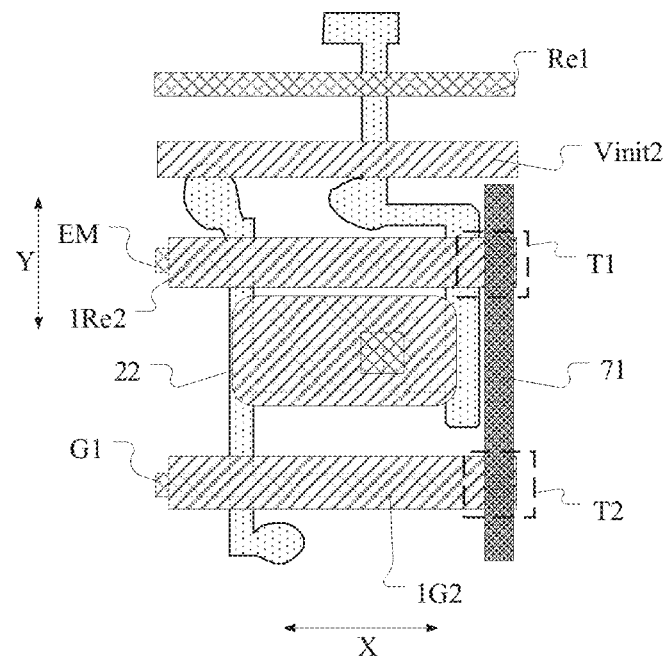
FIG. 14 is a structural layout of the first active layer, the first conductive layer, the second conductive layer and the second active layer in FIG. 4.
Figure 15:
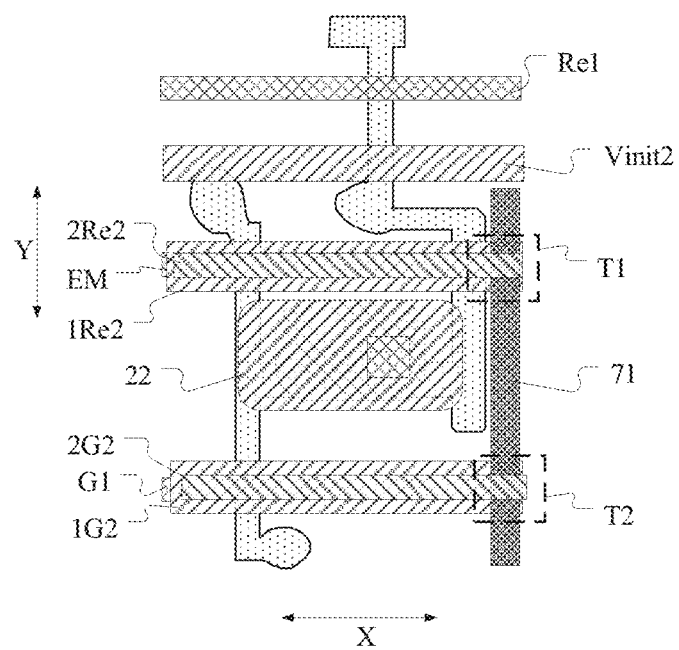
FIG. 15 is a structural layout of the first active layer, the first conductive layer, the second conductive layer, the second active layer and the third conductive layer in FIG. 4.
Figure 16:
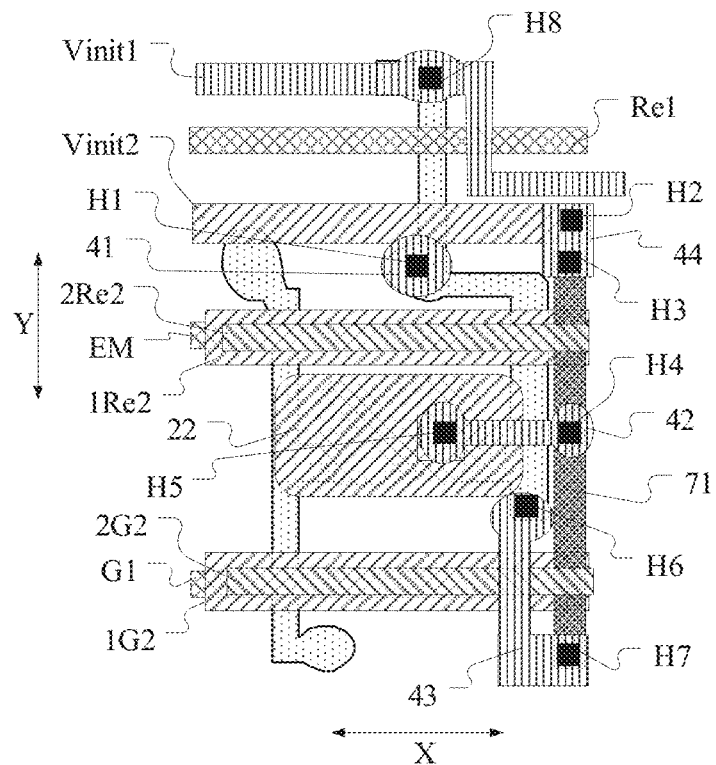
FIG. 16 is a structural layout of the first active layer, the first conductive layer, the second conductive layer, the second active layer, the third conductive layer and the fourth conductive layer in FIG. 4.

As shown in FIG. 4, it is the structural layout of the display panel of another example embodiment of the disclosure. The display panel may include the pixel driving circuit shown in FIG. 2. The display panel may also include a base substrate, a first active layer, a first conductive layer, a second conductive layer, a second active layer, a third conductive layer, a fourth conductive layer, and a fifth conductive layer which are sequentially stacked. The display panel may also include an insulating layer located between the above adjacent structural layers. As shown in FIGS. 5-16, FIG. 5 is a structural layout of the first active layer in FIG. 4, FIG. 6 is a structural layout of the first conductive layer in FIG. 4, FIG. 7 is a structural layout of the second conductive layer in FIG. 4, FIG. 8 is a structural layout of the second active layer in FIG. 4, FIG. 9 is a structural layout of the third conductive layer in FIG. 4, FIG. 10 is a structural layout of the fourth conductive layer in FIG. 4, FIG. 11 is a structural layout of the fifth conductive layer in FIG. 4, FIG. 12 is a structural layout of the first active layer and the first conductive layer in FIG. 4, FIG. 13 is a structural layout of the first active layer, the first conductive layer and the second conductive layer in FIG. 4, FIG. 14 is a structural layout of the first active layer, the first conductive layer, the second active layer in FIG. 4, FIG. 15 is a structural layout of the first active layer, the first conductive layer, the second conductive layer, the second active layer and the third conductive layer in FIG. 4, and FIG. 16 is a structural layout of the first active layer, the first conductive layer, the second conductive layer, the second active layer, the third conductive layer and the fourth conductive layer in FIG. 4.

Figure 5:
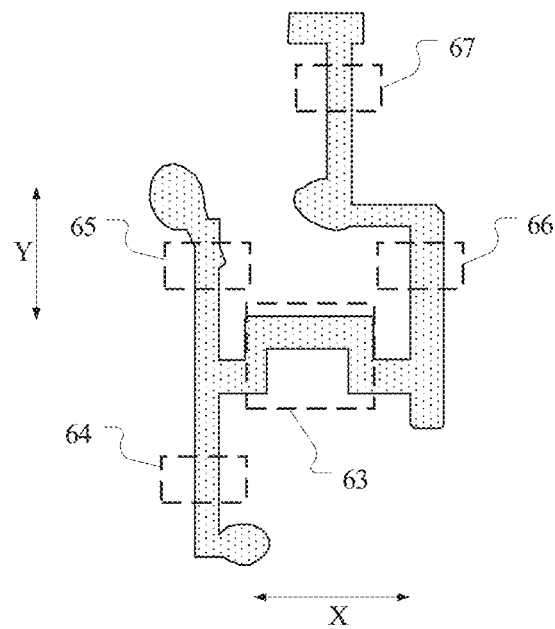
FIG. 5 is a structural layout of the first active layer in FIG. 4.

As shown in FIGS. 4, 5 and 12, the first active layer may include: a third active part 63, a fourth active part 64, a fifth active part 65, a sixth active part 66, and a seventh active part 67. The third active part 63 can be used to form the channel region of the driving transistor T3 in FIG. 2, the fourth active part 64 can be used to form the channel region of the fourth transistor T4, the fifth active part 65 can be used to form the channel region of the fifth transistor T5, the sixth active part 66 can be used to form the channel region of the sixth transistor T6, and the seventh active part 67 can be used to form the channel region of the seventh transistor T7. The first active layer may be formed of a polysilicon semiconductor.

As shown in FIGS. 4, 6 and 12, the first conductive layer may include a first conductive part 11, a first gate driving signal line G1, a first reset signal line Re1 and an enable signal line EM. The first conductive part 11 may be used to form the gate of the driving transistor T3 and an electrode of the capacitor C. The first gate driving signal line G1 may be used to provide the first gate driving signal terminal G1 in FIG. 2, the first reset signal line Re1 may be used to provide the first reset signal terminal Re1 in FIG. 2, and the enable signal line EM may be used to provide the enable signal terminal EM in FIG. 2. A part of the structure of the first gate line driving signal line G1 can be used to form the gate of the fourth transistor T4, a part of the structure of the first reset signal line Re1 can be used to form the gate of the seventh transistor T7, and a part of the structure of the enable signal line EM can be used to form the gates of the fifth transistor T5 and the sixth transistor T6. The orthographic projection of the first gate driving signal line G1 on the base substrate can extend along the first direction X, the orthographic projection of the first reset signal line Re1 on the base substrate can extend along the first direction X, and the orthographic projection of the enable signal line EM on the base substrate can extend along the first direction X. The orthographic projection of the first gate driving signal line G1 on the base substrate, the orthographic projection of the first conductive part 11 on the base substrate, the orthographic projection of the enable signal line EM on the base substrate, and the orthographic projection of the first reset signal line Re1 on the base substrate can be sequentially distributed in the second direction Y. The first direction X intersects with the second direction Y. For example, the first direction X and the second direction Y are perpendicular. In addition, the first reset signal line Re1 in the pixel driving circuit of this row can also be used as the first gate driving signal line G1 in the pixel driving circuit of the previous row. It should be noted that this disclosure can use the first conductive layer as a mask to perform the conductive treatment on the first active layer. That is, the first active layer covered by the first conductive layer forms the channel region of the transistor, and the first active layer not covered by the first conductive layer forms the conductor structure.

As shown in FIGS. 4, 7 and 13, the second conductive layer may include: a third gate line 1G2, a fourth gate line 1Re2, a second initial signal line Vinit2, and a second conductive part 22. The third gate line 1G2 can be used to provide the second gate driving signal terminal G2 in FIG. 2. The fourth gate line 1Re2 can be used to provide the second reset signal terminal Re2 in FIG. 2. The second initial signal line Vinit2 can be used to provide the second initial signal terminal Vinit2 in FIG. 2. The orthographic projection of the second conductive part 22 on the base substrate can at least partially overlap with the orthographic projection of the first conductive part 11 on the base substrate. The second conductive part 22 can be used to form another electrode of the capacitor C in FIG. 2. An opening 221 is provided on the second conductive part 22. A part of the structure of the third gate line 1G2 can be used to form the second gate of the second transistor T2 in FIG. 2, and a part of the structure of the fourth gate line 1Re2 can be used to form the second gate of the first transistor T1 in FIG. 2. As shown in FIG. 13, the orthographic projection of the third gate line 1G2 on the base substrate can at least partially overlap with the orthographic projection of the first gate driving signal line G1 on the base substrate. For example, any segment of the orthographic projection of the third gate line 1G2 on the base substrate in its extension direction may at least partially overlap with an orthogonal projection of the first gate driving signal line on the base substrate. The orthographic projection of the fourth gate line 1Re2 on the base substrate can at least partially overlap with the orthographic projection of the enable signal line EM on the base substrate. For example, any segment of the orthographic projection of the fourth gate line 1Re2 on the base substrate in its extension direction may at least partially overlap with an orthogonal projection of the enable signal line EM on the base substrate. In the display panel provided by the present disclosure, the fourth gate line 1Re2 is arranged directly above the enable signal line EM, and the third gate line 1G2 is arranged directly above the first gate driving signal line G1, so that the layout area of the first pixel driving circuit can be reduced. In addition, the orthographic projection of the third gate line 1G2 on the base substrate can extend along the first direction X. The orthographic projection of the fourth gate line 1Re2 on the base substrate can extend along the first direction X. The orthographic projection of the second initial signal line Vinit2 on the base substrate can extend along the first direction. The orthographic projection of the second initial signal line Vinit2 on the base substrate may be located between the orthographic projection of the fourth gate line 1Re2 on the base substrate and the orthographic projection of the fourth gate line 1Re2 on the base substrate.

As shown in FIGS. 4, 8, and 14, the second active layer may include a first active part 71. The first active part 71 may include a first sub-active part 711, a second sub-active part 712, and a third sub-active part 713 connected with the first sub-active part 711 and the second sub-active part 712. The first sub-active part 711 may be used to form a channel region of the first transistor T1. The second sub-active part 712 may be used to form a channel region of the second transistor T2. An orthographic projection of the first active part 71 on the base substrate may extend along a second direction Y. The second active layer may be formed of an oxide semiconductor. For example, the second active layer may be formed of indium gallium zinc oxide.

As shown in FIGS. 4, 9 and 15, the third conductive layer may include a second gate driving signal line 2G2, and a third gate driving signal line 2Re2. The second gate driving signal line 2G2 can be used to provide the second gate driving signal terminal G2 in FIG. 2, and the third gate driving signal line 2Re2 can be used to provide the second reset signal terminal Re2 in FIG. 2. A part of the structure of the second gate driving signal line 2G2 can be used to form the first gate of the second transistor T2, and a part of the structure of the third gate driving signal line 2Re2 can be used to form the first gate of the first transistor T1. The orthographic projection of that third gate driving signal line 2Re2 on the base substrate may extend along the first direction X, and the orthographic projection of the second gate driving signal line 2G2 on the base substrate may extend along the first direction X. The orthographic projection of the second gate driving signal line 2G2 on the base substrate can at least partially overlap with the orthographic projection of the first gate driving signal line G1 on the base substrate. For example, any segment of the orthographic projection of the second gate driving signal line 2G2 on the base substrate in its extension direction may at least partially overlap with an orthogonal projection of the first gate driving signal line G1 on the base substrate. The orthographic projection of the third gate driving signal line 2Re2 on the base substrate can at least partially overlap with the orthographic projection of the enable signal line EM on the base substrate. For example, any segment of the orthographic projection of the third gate driving signal line 2Re2 on the base substrate in its extension direction may at least partially overlap with an orthogonal projection of the enable signal line EM on the base substrate. In the display panel provided by the present disclosure, the third gate driving signal line 2Re2 is arranged directly above the enable signal line EM, and the second gate driving signal line 2G2 is arranged directly above the first gate driving signal line G1, so that the layout area of the first pixel driving circuit can be reduced. As shown in FIG. 14, the orthographic projection of the first conductive part 11 on the base substrate may be located between the orthographic projection of the second gate driving signal line 2G2 on the base substrate and the orthographic projection of the third gate driving signal line 2Re2 on the base substrate. It should be noted that the present disclosure may use the third conductive layer as a mask to perform the conductive treatment on the second active layer. That is, the second active layer covered by the third conductive layer forms the channel region of the transistor, and the second active layer not covered by the third conductive layer forms the conductor structure.

As shown in FIGS. 4, 10 and 16, the fourth conductive layer may include a first initial signal line Vinit1, a first connection part 41, a second connection part 42, a third connection part 43, and a fourth connection part 44. The first initial signal line Vinit1 can be used to provide the first initial signal terminal Vinit1 in FIG. 2. The first connection part 41 may connect the first active layer between the seventh active part 67 and the sixth active part 66 through the via hole H1, to connect the second electrode of the sixth transistor T6, and the first connection part 41 may be used to connect an electrode of the light emitting unit. The second connection part 42 can be connected to the third sub-active part 713 through the via hole H4, and connected to the first conductive part 11 through the via hole H5, thereby connecting the gate of the driving transistor T3 with the first electrode of the first transistor T1 and the first electrode of the second transistor T2. The orthographic projection of the via hole H5 on the base substrate is located within the orthographic projection of the opening 221 on the base substrate. That is, there is a gap between the edge of the orthographic projection of the via hole H5 on the base substrate and the edge of the orthographic projection of the opening 221 on the base substrate, so that the conductor filled in the via hole H5 will not be electrically connected with the second conductive part 22. The third connection part 43 may be connected to the first active layer on the side of the sixth active part 66 through a via hole H6, and connected to the second active layer on the side of the second sub-active part 712 away from the first sub-active part 711 through a via hole H7, so as to connect the second electrode of the second transistor T2 and the second electrode of the driving transistor T3. The fourth connection part 44 may be connected to the second initial signal line Vinit2 through the via hole H2, and at the same time, connected to the second active layer on the side of the first sub-active part 711 away from the second sub-active part 712 through the via hole H3, to connect the second electrode of the first transistor T1 and the second initial signal terminal Vinit2. The first initial signal line Vinit1 may be connected to the first active layer on the side of the seventh active part 67 through a via hole H8, to connect the first initial signal terminal Vinit1 and the second electrode of the seventh transistor T7.

As shown in FIGS. 4 and 11, the fifth conductive layer may include a power supply line VDD and a data line Da. The power supply line VDD can be used to provide the first power supply terminal VDD in FIG. 2, and the data line Da can be used to provide the data signal terminal Da in FIG. 2. The power supply line VDD may be connected to the first active layer on the side of the fifth active part 65 through the via hole H9, to connect the first electrode of the fifth transistor and the first power supply terminal VDD. The data line Da may be connected to the first active layer on the side of the fourth active part 64 through the via hole H10, to connect the first electrode of the fourth transistor T4 and the data signal terminal Da. In addition, the orthographic projection of the power line VDD on the base substrate may extend along the second direction Y, and the orthographic projection of the data line Da on the base substrate may extend along the second direction Y. The power supply line VDD may also be connected to the second conductive part 22.

Figure 17:
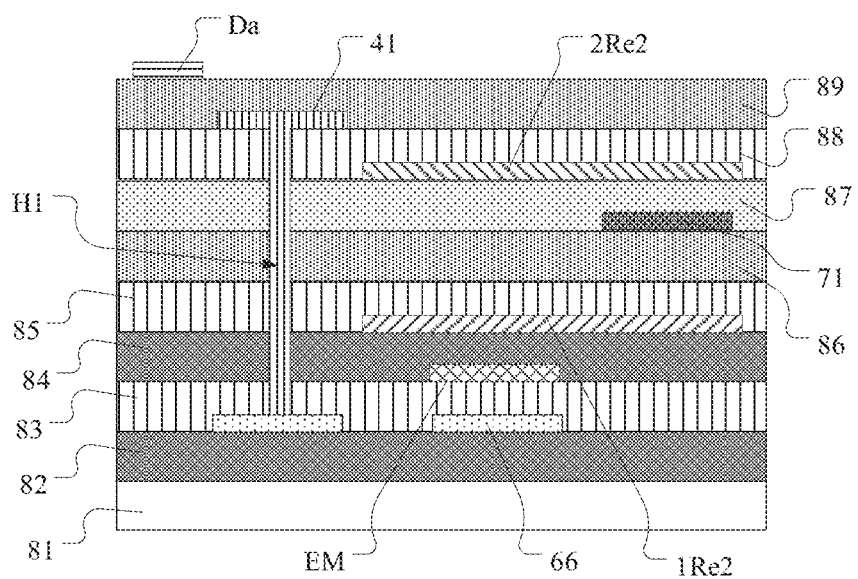
FIG. 17 is a cross-sectional view taken along the dotted line A in FIG. 4.

As shown in FIG. 17, which is a cross-sectional view along dotted line A in FIG. 4. The display panel may further include a first buffer layer 82, a first insulating layer 83, a first dielectric layer 84, a second dielectric layer 85, a second buffer layer 86, a second insulating layer 87, a third dielectric layer 88 and a first flat layer 89. The base substrate 81, the first buffer layer 82, the first active layer, the first insulating layer 83, the first conductive layer, the first dielectric layer 84, the second conductive layer, the second dielectric layer 85, the second buffer layer 86, the second active layer, the second insulating layer 87, the third conductive layer, the third dielectric layer 88, the fourth conductive layer, the first flat layer 89, and the fifth conductive layer are sequentially stacked. The base substrate 81 may include a first polyimide layer, a barrier layer and a second polyimide layer which are sequentially stacked. The barrier layer may be an inorganic material. The first buffer layer 82 and the second buffer layer 86 may include at least one of a silicon oxide layer and a silicon nitride layer. The first insulating layer and the second insulating layer may be a silicon oxide layer. The first dielectric layer 84, the second dielectric layer 85 and the third dielectric layer 88 may be a silicon nitride layer or a silicon oxide layer. The first flat layer 89 may be an organic material, such as polyimide (PI), polyethylene terephthalate (PET), polyethylene naphthalate (PEN), silicon-glass bonded structure (SOG) and other materials. The material of the fourth conductive layer and the fifth conductive layer may include metal materials, such as one of molybdenum, aluminum, copper, titanium and niobium or an alloy thereof, or molybdenum/titanium alloy or lamination, or titanium/aluminum/titanium lamination. The material of the first conductive layer, the second conductive layer and the third conductive layer can be one of molybdenum, aluminum, copper, titanium and niobium or an alloy thereof, or molybdenum/titanium alloy or lamination. It should be noted that the display panel can also include a second flat layer on the side of the fifth conductive layer away from the base substrate, and an anode layer on the side of the second flat layer away from the base substrate. The anode layer can be used to form the anode of the light emitting unit.

In this example embodiment, since the orthographic projection of the third gate line 1G2 on the base substrate at least partially overlaps with the orthographic projection of the first gate driving signal line G1 on the base substrate, both the third gate line 1G2 and the first gate driving signal line G1 have large impedance loading (RC loading), which will affect the response speed of the second transistor T2 and the fourth transistor T4. In this example embodiment, the thickness of the dielectric layer between the third gate line 1G2 and the first gate driving signal line G1 may be greater than the thickness of the dielectric layer between the first conductive part 11 and the second conductive part 22, which can reduce the impedance load of the third gate line 1G2 and the first gate driving signal line G1 on the premise of ensuring the capacitance value of the capacitor C. Specifically, in the present disclosure, the dielectric layer between the first conductive layer and the second conductive layer can be locally etched, to thin the dielectric layer at the position of the capacitor C. Similarly, the thickness of the dielectric layer between the fourth gate line 1Re2 and the enable signal line EM may be greater than the thickness of the dielectric layer between the first conductive part 11 and the second conductive part 22.

In this example embodiment, the orthographic projection of a part of the structure of the fifth conductive layer on the base substrate can also cover the orthographic projection of the first active part 71 on the base substrate, and the part of the structure of the fifth conductive layer can shield light for the first active part 71. In addition, the part of the structure of the fifth conductive layer can also be connected to a stable voltage source, so that the part of the structure of the fifth conductive layer can be used as a shielding layer, to shield the interference of other signals on the first transistor and the second transistor. For example, the part of the structure of the fifth conductive layer can be connected to the power supply line VDD at one side thereof, and the part of the structure of the fifth conductive layer can also be connected to stable voltage sources of other levels through via holes.

In this example embodiment, the orthographic projection of the first active part 71 on the base substrate may not overlap with the orthographic projection of the first active layer on the base substrate. For example, as shown in FIG. 14, the orthographic projection of the first active part 71 on the base substrate may be located on the side where the orthographic projection of the sixth active part 66 on the base substrate is away from the orthographic projection of the third active part 63 on the base substrate. In other example embodiments, the orthographic projection of the first active part 71 on the base substrate can also be located on the side where the orthographic projection of the fourth active part 64 on the base substrate is away from the orthographic projection of the third active part 63 on the base substrate.

Figure 18:
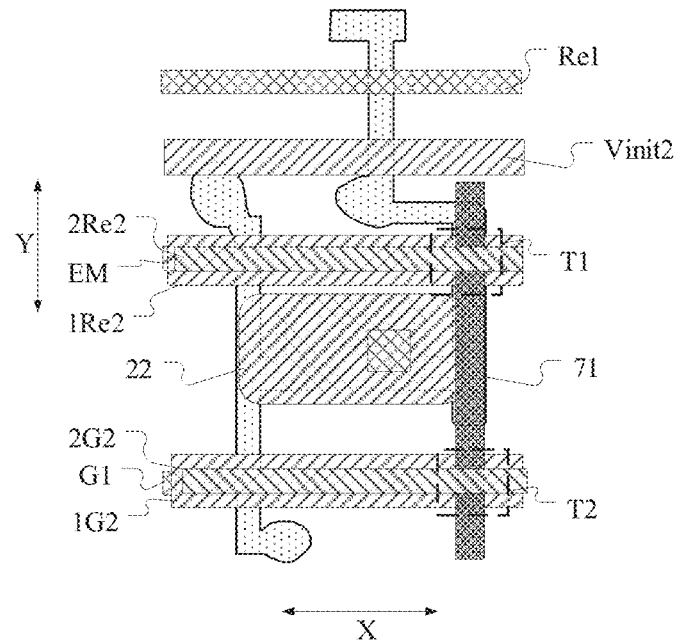
FIG. 18 is a structural layout of the display panel of another example embodiment of the present disclosure.
Figure 19:
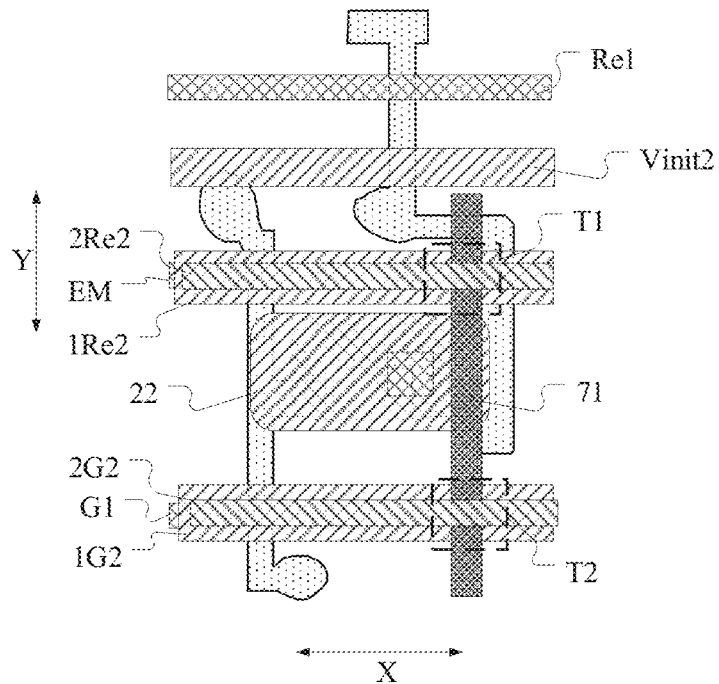
FIG. 19 is a structural layout of the display panel of another example embodiment of the present disclosure.

It should be understood that in other example embodiments, the orthographic projection of the first active part 71 on the base substrate may also at least partially overlap with the orthographic projection of the first active layer on the base substrate, which can further reduce the layout area of the first pixel driving circuit. For example, as shown in FIG. 18, it is a structural layout of the display panel of another example embodiment of the present disclosure. FIG. 18 only shows the structural layout of the first active layer, the first conductive layer, the second conductive layer, the second active layer and the third conductive layer. The display panel shown in FIG. 18 is different from the display panel shown in FIG. 4 only in that the orthographic projection of the first sub-active part 711 on the base substrate at least partially overlaps with the orthographic projection of the sixth active part on the base substrate, which can not only reduce the layout area of the first pixel driving circuit, but also play a shielding role for the first sub-active part 711 by the sixth active part 66. In addition, it should be understood that in other example embodiments, the orthographic projection of the first sub-active part 711 on the base substrate can also at least partially overlap with the orthographic projection of the fifth active part on the base substrate, and the orthographic projection of the second sub-active part 712 on the base substrate can also at least partially overlap with the orthographic projection of the fourth active part on the base substrate. For another example, as shown in FIG. 19, it is a structural layout of the display panel of another example embodiment of the present disclosure. FIG. 19 only shows the structural layout of the first active layer, the first conductive layer, the second conductive layer, the second active layer and the third conductive layer. The display panel shown in FIG. 19 is different from the display panel shown in FIG. 4 only in that, the orthographic projection of the first active part 71 on the base substrate is located between the orthographic projection of the sixth active part on the base substrate and the orthographic projection of the third active part on the base substrate. The orthographic projection of the third sub-active part 713 on the base substrate can at least partially overlap with the orthographic projection of the second conductive part 22 on the base substrate. Since the third sub-active part 713 is connected to the gate of the driving transistor T3, the third sub-active part 713 and the second conductive part 22 can form a parallel plate capacitor structure, to increase the capacitance value of the capacitor C. In addition, in other exemplary embodiments, the orthographic projection of the first active part 71 on the base substrate may also be located between the orthographic projection of the fifth active part on the base substrate and the orthographic projection of the third active part on the base substrate.

Figure 20:
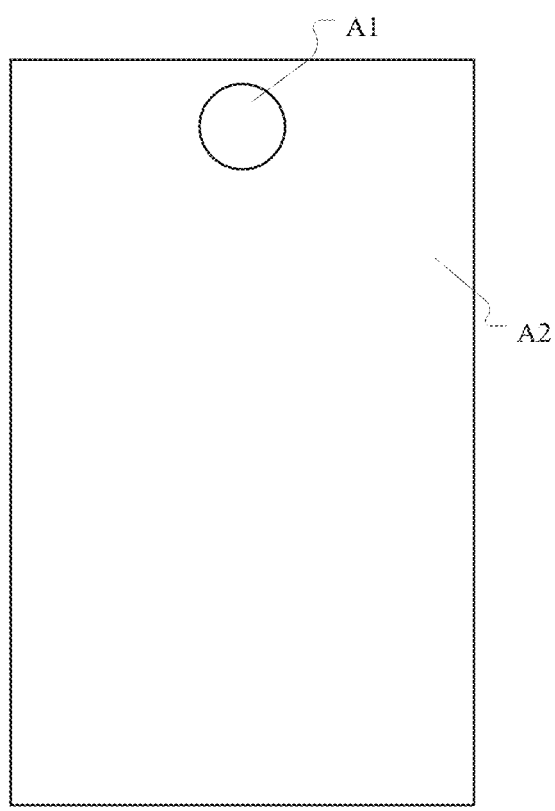
FIG. 20 is a structural schematic diagram of the display panel of another example embodiment of the present disclosure.

As shown in FIG. 20, it is a structural schematic diagram of the display panel of another example embodiment of the present disclosure. The display panel may further include a first display area A1 and a second display area A2. The light transmittance of the first display area A1 may be greater than that of the second display area A2. The first pixel driving circuit and the first light emitting unit connected thereto can be located in the first display area A1. The second display area A2 can be provided with an existing pixel driving circuit. The existing pixel driving circuit can have the same equivalent circuit as the above first pixel driving circuit. The existing pixel driving circuit is different from the above first pixel driving circuit in that, in the existing pixel driving circuit, the orthographic projection of the gate line for forming the low-temperature polysilicon transistor on the base substrate does not overlap with the orthographic projection of the gate line for forming the oxide transistor on the base substrate. The first display area A1 can be used for setting sensor devices, such as cameras. In this disclosure, the pixel driving circuit in the first display area A1 is set as the structure of the above first pixel driving circuit. Since the first pixel driving circuit has a small layout area, the light transmittance of the first display area A1 can be improved. In addition, it can also improve the pixel density of the first display area A1 while keeping the light transmittance unchanged, so that the pixel density of the first display area A1 and the second display area A2 are the same or similar, so as to reduce the display difference between the first display area and the second display area. It should be understood that in other example embodiments, the first display area A1 may not be provided with a pixel driving circuit, and the first display area A1 may only be provided with a light emitting unit. The display panel may set the above first pixel driving circuit in the second display area A2, thereby providing a driving current to the light emitting unit in the first display area A1 through the first pixel driving circuit in the second display area A2.

This example embodiment provides a display apparatus, which includes the above display panel. The display apparatus can be a mobile phone, a tablet computer, a television and other display apparatuses. The display apparatus may further include a sensing device, which may be directly opposite to the first display area. The sensing device can be a camera and other sensing devices.

Other embodiments of the present disclosure will readily come to the mind of those skilled in the art after considering the specification and practicing the disclosure disclosed herein. This application is intended to cover any variations, uses, or adaptations of the present disclosure that follow the general principles of the present disclosure and include commonly known or customary technical means in the art that are not disclosed herein. The specification and embodiments are to be considered exemplary only, and the true scope and spirit of the present disclosure is indicated by the appended claims.

It should be understood that the present disclosure is not limited to the precise structure described above and shown in the drawings, and various modifications and changes can be made without departing from its scope. The scope of the present disclosure is defined only by the appended claims.

What is claimed is:

1. A display panel, wherein the display panel comprises a first pixel driving circuit, the first pixel driving circuit comprises a low-temperature polysilicon transistor and an oxide transistor, the display panel further comprises: a base substrate; a first conductive layer, located on a side of the base substrate, wherein the first conductive layer comprises a first gate line, and a part of a structure of the first gate line is used to form a gate of the low-temperature polysilicon transistor; and a third conductive layer, located on a side of the first conductive layer away from the base substrate, wherein the third conductive layer comprises a second gate line, and a part of a structure of the second gate line is used to form a gate of the oxide transistor, wherein an orthographic projection of the first gate line on the base substrate extends along a first direction, an orthographic projection of the second gate line on the base substrate extends along the first direction, and the orthographic projection of the first gate line on the base substrate at least partially overlaps with the orthographic projection of the second gate line on the base substrate, wherein the first pixel driving circuit further comprises a driving transistor, the first pixel driving circuit comprises at least one oxide transistor and at least one low-temperature polysilicon transistor, the first conductive layer comprises at least one first gate line, the third conductive layer comprises at least one second gate line, wherein the first pixel driving circuit is used to drive a first light emitting unit, the at least one oxide transistor comprises a first transistor, and the at least one low-temperature polycrystalline silicon transistor comprises a fifth transistor and a sixth transistor, a first electrode of the first transistor is connected to a gate of the driving transistor, a second electrode of the first transistor is connected to a second initial signal terminal, a first electrode of the fifth transistor is connected to a first power supply terminal, a second electrode of the fifth transistor is connected to a first electrode of the driving transistor, a first electrode of the sixth transistor is connected to a second electrode of the driving transistor, and a second electrode of the sixth transistor is connected to the first light emitting unit, the at least one first gate line comprises: an enable signal line, wherein a part of a structure of the enable signal line is used to form gates of the fifth transistor and the sixth transistor; the at least one second gate line comprises: a third gate driving signal line, wherein a part of a structure of the third gate driving signal line is used to form a first gate of the first transistor; wherein an orthographic projection of the third gate driving signal line on the base substrate at least partially overlaps with an orthographic projection of the enable signal line on the base substrate.

2. The display panel according to claim 1, wherein the at least one oxide transistor comprises a second transistor, and the at least one low-temperature polysilicon transistor comprises a fourth transistor, a first electrode of the fourth transistor is connected to a data signal terminal, and a second electrode of the fourth transistor is connected to a first electrode of the driving transistor, a first electrode of the second transistor is connected to a gate of the driving transistor, and a second electrode of the second transistor is connected to a second electrode of the driving transistor;

the at least one first gate line comprises:
a first gate driving signal line, wherein a part of a structure of the first gate driving signal line is used to form a gate of the fourth transistor;
the at least one second gate line comprises:
a second gate driving signal line, wherein at least a part of a structure of the second gate driving signal line is configured to form a first gate of the second transistor.

3. The display panel according to claim 1, wherein the display panel further comprises: a second active layer, located between the first conductive layer and the third conductive layer, wherein a part of a structure of the second active layer is used to form channel regions of the first transistor and a second transistor; a second conductive layer, located between the first conductive layer and the second active layer, wherein the second conductive layer comprises a third gate line and a fourth gate line, an orthographic projection of the third gate line on the base substrate extends along the first direction, and an orthographic projection of the fourth gate line on the base substrate extends along the first direction; wherein a part of a structure of the third gate line is used to form a second gate of the second transistor, and the orthogonal projection of the third gate line on the base substrate at least partially overlaps with an orthogonal projection of a first gate driving signal line on the base substrate; a part of a structure of the fourth gate line is used to form a second gate of the first transistor, and the orthogonal projection of the fourth gate line on the base substrate at least partially overlaps with the orthogonal projection of the enable signal line on the base substrate.

4. The display panel according to claim 3, wherein, any segment of the orthographic projection of the first gate driving signal line on the base substrate in its extension direction at least partially overlaps with an orthogonal projection of a second gate driving signal line on the base substrate; any segment of the orthographic projection of the third gate driving signal line on the base substrate in its extension direction at least partially overlaps with the orthographic projection of the enable signal line on the base substrate; any segment of the orthographic projection of the third gate line on the base substrate in its extension direction at least partially overlaps with the orthographic projection of the first gate driving signal line on the base substrate; any segment of the orthographic projection of the fourth gate line on the base substrate in its extension direction at least partially overlaps with the orthogonal projection of the enable signal line on the base substrate.

5. The display panel according to claim 1, wherein the first conductive layer further comprises: a first conductive part, for forming the gate of the driving transistor, wherein an orthographic projection of the first conductive part on the base substrate is located between an orthographic projection of a second gate driving signal line on the base substrate and the orthographic projection of the third gate driving signal line on the base substrate.

6. The display panel according to claim 1, wherein the display panel further comprises:
a first active layer, located between the base substrate and the first conductive layer, wherein a part of a structure of the first active layer is used to form a channel region of the low-temperature polysilicon transistor;
a second active layer, located between the first conductive layer and the third conductive layer, wherein a part of a structure of the second active layer is used to form a channel region of the oxide transistor,
wherein an orthographic projection of the first active layer on the base substrate at least partially overlaps with the an orthographic projection of the second active layer on the base substrate.

7. The display panel according to claim 6, wherein the first pixel driving circuit is used to drive a first light emitting unit, the first pixel driving circuit further comprises a driving transistor, the first pixel driving circuit comprises at least one oxide transistor and at least one low-temperature polysilicon transistor, the at least one oxide transistor comprises a first transistor and a second transistor, and the at least one low-temperature polysilicon transistor comprises a sixth transistor;
a first electrode of the first transistor is connected to a gate of the driving transistor, a second electrode of the first transistor is connected to a second initial signal terminal, a first electrode of the second transistor is connected to the gate of the driving transistor, a second electrode of the second transistor is connected to a second electrode of the driving transistor, a first electrode of the sixth transistor is connected to the second electrode of the driving transistor, and a second electrode of the sixth transistor is connected to the first light emitting unit;
the second active layer comprises a first active part, the first active part comprises a first sub-active part, a second sub-active part, and a third sub-active part connected between the first sub-active part and the second sub-active part, wherein the first sub-active part is used to form a channel region of the first transistor, the second sub-active part is used to form a channel region of the second transistor, and an orthographic projection of the first active part on the base substrate extends along a second direction, the first direction intersects with the second direction;
the first active layer comprises a sixth active part for forming a channel region of the sixth transistor, wherein an orthographic projection of the sixth active part on the base substrate at least partially overlaps with an orthographic projection of the first sub-active part on the base substrate.

8. The display panel according to claim 6, wherein the first pixel driving circuit further comprises a driving transistor, the first pixel driving circuit comprises at least one oxide transistor and at least one low-temperature polysilicon transistor, and the at least one oxide transistor comprises a first transistor and a second transistor; a first electrode of the first transistor is connected to a gate of the driving transistor, a second electrode of the first transistor is connected to a second initial signal terminal, a first electrode of the second transistor is connected to the gate of the driving transistor, a second electrode of the second transistor is connected to a second electrode of the driving transistor; a first active part comprises a first sub-active part, a second sub-active part, and a third sub-active part connected between the first sub-active part and the second sub-active part, wherein the first sub-active part is used to form a channel region of the first transistor, the second sub-active part is used to form a channel region of the second transistor; the first active layer comprises a third active part for forming a channel region of the driving transistor; the first conductive layer further comprises a first conductive part, wherein an orthographic projection of the first conductive part on the base substrate covers an orthographic projection of the third active part on the base substrate, the first conductive part is used to form the gate of the driving transistor; the display panel further comprises: a second conductive layer, located between the first conductive layer and the second active layer, wherein the second conductive layer comprises a second conductive part, the second conductive part is used to connect a first power supply terminal, and an orthographic projection of the second conductive part on the base substrate at least partially overlaps with the orthographic projection of the first conductive part on the base substrate; an orthographic projection of that third sub-active part on the base substrate at least partially overlaps with the orthographic projection of the second conductive part on the base substrate.

9. The display panel according to claim 6, wherein the first pixel driving circuit is used to drive a first light emitting unit, the first pixel driving circuit further comprises a driving transistor, the first pixel driving circuit comprises at least one oxide transistor and at least one low-temperature polysilicon transistor, the at least one oxide transistor comprises a first transistor and a second transistor, and the at least one low-temperature polysilicon transistor comprises a sixth transistor;

a first electrode of the first transistor is connected to a gate of the driving transistor, a second electrode of the first transistor is connected to a second initial signal terminal, a first electrode of the second transistor is connected to the gate of the driving transistor, a second electrode of the second transistor is connected to a second electrode of the driving transistor, a first electrode of the sixth transistor is connected to the second electrode of the driving transistor, and a second electrode of the sixth transistor is connected to the first light emitting unit;

the second active layer comprises a first active part, wherein a part of a structure of the first active part is used to form channel regions of the first transistor and the second transistor, and an orthographic projection of the first active part on the base substrate extends along a second direction, the first direction intersects with the second direction;

the first active layer comprises a third active part and a sixth active part, wherein the third active part is used to form a channel region of the driving transistor, and the sixth active part is used to form a channel region of the sixth transistor;

wherein, in the first direction, the orthographic projection of the first active part on the base substrate is located between an orthographic projection of the third active part on the base substrate and an orthographic projection of the sixth active part on the base substrate.

10. The display panel according to claim 1, wherein the display panel further comprises:

a first active layer, located between the base substrate and the first conductive layer, wherein a part of a structure of the first active layer is used to form a channel region of the low-temperature polysilicon transistor;

a second active layer, located between the first conductive layer and the third conductive layer, wherein a part of a structure of the second active layer is used to form a channel region of the oxide transistor, wherein an orthographic projection of the first active layer on the base substrate does not overlap with an orthographic projection of the second active layer on the base substrate.

11. The display panel according to claim 10, wherein the first pixel driving circuit is used to drive a first light emitting unit, the first pixel driving circuit further comprises a driving transistor, the first pixel driving circuit comprises at least one oxide transistor and at least one low-temperature polysilicon transistor, the at least one oxide transistor comprises a first transistor and a second transistor, and the at least one low-temperature polysilicon transistor comprises a sixth transistor;

a first electrode of the first transistor is connected to a gate of the driving transistor, a second electrode of the first transistor is connected to a second initial signal terminal, a first electrode of the second transistor is connected to the gate of the driving transistor, a second electrode of the second transistor is connected to a second electrode of the driving transistor, a first electrode of the sixth transistor is connected to the second electrode of the driving transistor, and a second electrode of the sixth transistor is connected to the first light emitting unit;

the second active layer comprises a first active part, wherein a part of a structure of the first active part is used to form channel regions of the first transistor and the second transistor, and an orthographic projection of the first active part on the base substrate extends along a second direction, the first direction intersects with the second direction;

the first active layer comprises a third active part and a sixth active part, wherein the third active part is used to form a channel region of the driving transistor, and the sixth active part is used to form a channel region of the sixth transistor;

wherein, in the first direction, the orthographic projection of the first active part on the base substrate is located on a side of an orthographic projection of the sixth active part on the base substrate away from an orthographic projection of the third active part on the base substrate.

12. The display panel according to claim 1, further comprising a first display area and a second display area, wherein a light transmittance of the first display area is greater than that of the second display area;

wherein the first pixel driving circuit is used to provide driving current to a first light emitting unit, and the first pixel driving circuit and the first light emitting unit are located in the first display area.

13. The display panel according to claim 1, further comprising a first display area and a second display area, wherein a light transmittance of the first display area is greater than that of the second display area;
wherein the first pixel driving circuit is used to provide driving current to a first light emitting unit, the first light emitting unit is located in the first display area, and the first pixel driving circuit is located in the second display area.

14. A display apparatus, comprising a display panel, wherein the display panel comprises a first pixel driving circuit, the first pixel driving circuit comprises a low-temperature polysilicon transistor and an oxide transistor, the display panel further comprises: a base substrate; a first conductive layer, located on a side of the base substrate, wherein the first conductive layer comprises a first gate line, and a part of a structure of the first gate line is used to form a gate of the low-temperature polysilicon transistor; and a third conductive layer, located on a side of the first conductive layer away from the base substrate, wherein the third conductive layer comprises a second gate line, and a part of a structure of the second gate line is used to form a gate of the oxide transistor, wherein an orthographic projection of the first gate line on the base substrate extends along a first direction, an orthographic projection of the second gate line on the base substrate extends along the first direction, and the orthographic projection of the first gate line on the base substrate at least partially overlaps with the orthographic projection of the second gate line on the base substrate, wherein the first pixel driving circuit further comprises a driving transistor, the first pixel driving circuit comprises at least one oxide transistor and at least one low-temperature polysilicon transistor, the first conductive layer comprises at least one first gate line, the third conductive layer comprises at least one second gate line, wherein the first pixel driving circuit is used to drive a first light emitting unit, the at least one oxide transistor comprises a first transistor, and the at least one low-temperature polycrystalline silicon transistor comprises a fifth transistor and a sixth transistor, a first electrode of the first transistor is connected to a gate of the driving transistor, a second electrode of the first transistor is connected to a second initial signal terminal, a first electrode of the fifth transistor is connected to a first power supply terminal, a second electrode of the fifth transistor is connected to a first electrode of the driving transistor, a first electrode of the sixth transistor is connected to a second electrode of the driving transistor, and a second electrode of the sixth transistor is connected to the first light emitting unit, the at least one first gate line comprises: an enable signal line, wherein a part of a structure of the enable signal line is used to form gates of the fifth transistor and the sixth transistor: the at least one second gate line comprises: a third gate driving signal line, wherein a part of a structure of the third gate driving signal line is used to form a first gate of the first transistor; wherein an orthographic projection of the third gate driving signal line on the base substrate at least partially overlaps with an orthographic projection of the enable signal line on the base substrate.

15. The display apparatus according to claim 14, wherein in a case that the display panel comprises a first display area, the display apparatus further comprises a sensing device, and the sensing device is directly opposite to the first display area.

16. The display apparatus according to claim 14, wherein the at least one oxide transistor comprises a second transistor, and the at least one low-temperature polysilicon transistor comprises a fourth transistor, a first electrode of the fourth transistor is connected to a data signal terminal, and a second electrode of the fourth transistor is connected to a first electrode of the driving transistor, a first electrode of the second transistor is connected to a gate of the driving transistor, and a second electrode of the second transistor is connected to a second electrode of the driving transistor;
the at least one first gate line comprises:
a first gate driving signal line, wherein a part of a structure of the first gate driving signal line is used to form a gate of the fourth transistor;
the at least one second gate line comprises:
a second gate driving signal line, wherein at least a part of a structure of the second gate driving signal line is configured to form a first gate of the second transistor.

17. The display apparatus according to claim 14 wherein the display apparatus further comprises: a second active layer, located between the first conductive layer and the third conductive layer, wherein a part of a structure of the second active layer is used to form channel regions of the first transistor and a second transistor; a second conductive layer, located between the first conductive layer and the second active layer, wherein the second conductive layer comprises a third gate line and a fourth gate line, an orthographic projection of the third gate line on the base substrate extends along the first direction, and an orthographic projection of the fourth gate line on the base substrate extends along the first direction; wherein a part of a structure of the third gate line is used to form a second gate of the second transistor, and the orthogonal projection of the third gate line on the base substrate at least partially overlaps with an orthogonal projection of a first gate driving signal line on the base substrate; a part of a structure of the fourth gate line is used to form a second gate of the first transistor, and the orthogonal projection of the fourth gate line on the base substrate at least partially overlaps with the orthogonal projection of the enable signal line on the base substrate.

18. The display apparatus according to claim 17, wherein, any segment of the orthographic projection of the first gate driving signal line on the base substrate in its extension direction at least partially overlaps with an orthogonal projection of a second gate driving signal line on the base substrate; any segment of the orthographic projection of the third gate driving signal line on the base substrate in its extension direction at least partially overlaps with the orthographic projection of the enable signal line on the base substrate; any segment of the orthographic projection of the third gate line on the base substrate in its extension direction at least partially overlaps with the orthographic projection of the first gate driving signal line on the base substrate; any segment of the orthographic projection of the fourth gate line on the base substrate in its extension direction at least partially overlaps with the orthogonal projection of the enable signal line on the base substrate.

* * * * *